US010770306B2

(12) United States Patent
Bar et al.

(10) Patent No.: US 10,770,306 B2
(45) Date of Patent: Sep. 8, 2020

(54) METHOD OF ETCHING A CAVITY IN A STACK OF LAYERS

(71) Applicant: STMicroelectronics (Crolles 2) SAS, Crolles (FR)

(72) Inventors: Pierre Bar, Grenoble (FR); Francois Leverd, Saint Ismier (FR); Delia Ristoiu, Saint Ismier (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/240,044

(22) Filed: Jan. 4, 2019

(65) Prior Publication Data

US 2019/0214270 A1   Jul. 11, 2019

(30) Foreign Application Priority Data

Jan. 5, 2018   (FR) ...................................... 18 50068

(51) Int. Cl.
*H01L 21/3065* (2006.01)
*H01L 21/311* (2006.01)
*H01L 21/308* (2006.01)
*H01L 21/02* (2006.01)
(Continued)

(52) U.S. Cl.
CPC ...... *H01L 21/31144* (2013.01); *G02B 6/3636* (2013.01); *G02B 6/3652* (2013.01); *G02B 6/3692* (2013.01); *H01L 21/02507* (2013.01); *H01L 21/3065* (2013.01);
(Continued)

(58) Field of Classification Search
CPC .......... H01L 21/31144; H01L 21/3086; H01L 21/3065; H01L 21/02507; H01L 21/31116; G02B 6/3692; G02B 6/3652; G02B 6/3636; G02B 6/42

See application file for complete search history.

(56) References Cited

U.S. PATENT DOCUMENTS

2002/0090576 A1   7/2002   Tu
2003/0032284 A1*  2/2003   Enomoto .......... H01L 21/31116
                                                438/687

(Continued)

FOREIGN PATENT DOCUMENTS

CN   102420170 A   4/2012

OTHER PUBLICATIONS

INPI Search Report and Written Opinion for FR 1850068 dated Aug. 15, 2018 (7 pages).

*Primary Examiner* — Nadine G Norton
*Assistant Examiner* — Mahmoud Dahimene
(74) *Attorney, Agent, or Firm* — Crowe & Dunlevy

(57) ABSTRACT

A cavity is etched in a stack of layers which includes a first layer made of a first material and a second layer made of a second material. To etch the cavity, a first etch mask having a first opening is formed over the stack of layer. The stack of layers is then etched through the first opening to a depth located in the second layer. A second mask having a second opening, the dimensions of which are smaller, in top view, than the first opening, is formed over the stack of layer. The second opening is located, in top view, opposite the area etched through the first opening. The second layer is then etched through the second opening to reach the first layer. The etch method used is configured to etch the second material selectively over the first material.

16 Claims, 3 Drawing Sheets

(51) Int. Cl.
*G02B 6/36* (2006.01)
*G02B 6/42* (2006.01)
(52) U.S. Cl.
CPC .... H01L 21/3086 (2013.01); H01L 21/31116 (2013.01); *G02B 6/42* (2013.01)

(56) References Cited

U.S. PATENT DOCUMENTS

| | | | | |
|---|---|---|---|---|
| 2008/0020565 A1* | 1/2008 | Tseng | .................. | G03F 1/54 438/633 |
| 2013/0023119 A1* | 1/2013 | Park | .................. | H01L 21/76808 438/675 |

\* cited by examiner

METHOD OF ETCHING A CAVITY IN A STACK OF LAYERS

PRIORITY CLAIM

This application claims the priority benefit of French Application for Patent No. 1850068, filed on Jan. 5, 2018, the content of which is hereby incorporated by reference in its entirety to the maximum extent allowable by law.

TECHNICAL FIELD

The present disclosure relates to the field of electronic chip manufacturing methods, and more particularly aims at a method of etching a cavity in a stack of layers for the manufacturing of an electronic chip.

BACKGROUND

In certain fields, there is a need for electronic chips comprising cavities of relatively large dimensions, formed in a stack of layers coating the chip substrate.

In particular, chips used in integrated photonics may comprise a substrate, for example, made of silicon, containing optical components, and a stack of layers, for example, insulating layers, coating the substrate. To connect an optical fiber external to the chip to the optical components of the substrate, it would be desirable to form in the stack of layers coating the substrate a cavity having sufficiently large dimensions to receive an end of the optical fiber, for example, a cavity having horizontal dimensions capable of reaching a few millimeters and a depth of several micrometers.

The manufacturing of a cavity having such dimensions may however raise various problems.

SUMMARY

An embodiment provides a method of etching a cavity in a stack of layers, the stack comprising a first layer made of a first material and a second layer made of a second material, the first layer forming the lower layer of the stack, and the upper surface of the first layer being in contact with the lower surface of the second layer, the method comprising the steps of: a) forming, on the upper surface of the stack, a first etch mask having a first opening; b) etching the stack opposite the first opening, and interrupting the etching in the second layer; c) forming, on the upper surface of the stack, a second mask having a second opening, the dimensions of the second opening being, in top view, smaller than those of the first opening, the second opening being located, in top view, opposite the area etched at step b); and d) etching the second layer opposite the second opening by an etch method capable of etching the second material selectively over the first material, to reach the first layer.

According to an embodiment, the stack comprises, above the second layer, a third layer made of the first material and a fourth layer made of the second material, above the third layer.

According to an embodiment, the third layer comprises a third opening opposite the first opening.

According to an embodiment, in top view, all the dimensions of the first opening are greater than 100 μm.

According to an embodiment, in top view, all the dimensions of the second opening are smaller by from 20 to 100 μm than the dimensions of the first opening.

According to an embodiment, the first and second materials are insulating materials.

According to an embodiment, the first and second materials are, respectively, silicon nitride and silicon oxide.

According to an embodiment, the etch method implemented at step b) is a method of plasma etching by means of a plasma made up of $CF_4$ and of nitrogen.

According to an embodiment, the etch method implemented at step d) is a method of plasma etching by means of a plasma made up of $C_4F_8$ and of dioxygen.

According to an embodiment, the method comprises a step e), subsequent to step d), of etching the first layer forming the lower layer of the stack.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
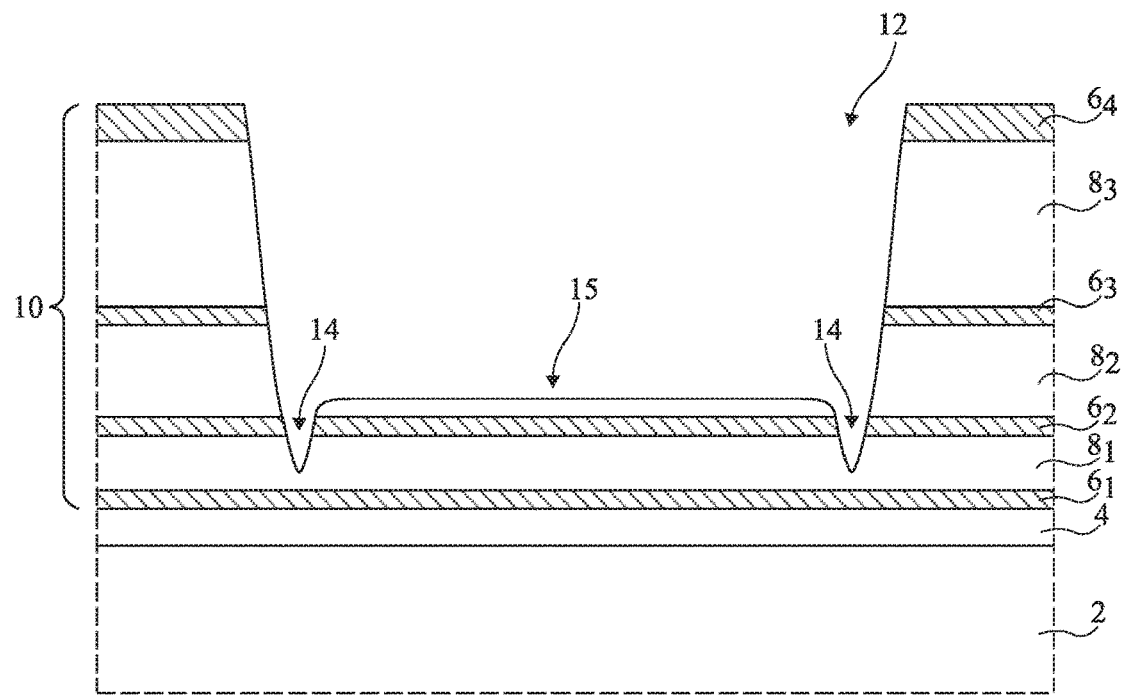
FIG. 1 is a partial simplified cross-section view of a chip portion comprising a cavity formed in a stack of layers coating the chip substrate.

The same elements have been designated with the same reference numerals in the various drawings and, further, the various drawings are not to scale. For clarity, only those steps and elements which are useful to the understanding of the described embodiments have been shown and are detailed. In particular, the various components that the described chips may comprise are not detailed. Similarly, the various possible uses of the chips are not detailed.

In the following description, when reference is made to terms qualifying relative position, such as terms "top", "bottom", "upper", "lower", etc., or terms qualifying orientation, such as terms "horizontal", "vertical", etc., reference is made to the orientation of the concerned element in the drawings, it being understood that, in practice, the described structures may have a different orientation. The terms "approximately", "substantially", and "in the order of" are used herein to designate a tolerance of plus or minus 10%, preferably of plus or minus 5% of the value in question.

FIG. 1 illustrates a problem which is posed when a cavity 12 of relatively large dimensions is desired to be etched in a chip. In this drawing, a chip comprising a substrate 2, for example, a semiconductor substrate, for example, made of silicon, inside of which or inside and on top of which integrated circuit components (not detailed) are formed, has been shown. These integrated circuit components are for example optical, electrical, or optoelectronic components. In the shown example, the chip further comprises a layer 4 made of an insulating material, for example, silicon oxide, coating the upper surface of substrate 2. The chip further comprises a stack 10 of layers coating the upper surface of layer 4. In this example, stack 10 comprises an alternation of layers 6 made of a first insulating material and of layers 8 made of a second insulating material. The first material is, for example, silicon nitride. The second material is, for example, silicon oxide. More particularly, in the shown example, stack 10 comprises, in the following order, starting from the upper surface of layer 4: a silicon nitride layer $6_1$, a silicon oxide layer $8_1$, a silicon nitride layer $6_2$, a silicon oxide layer $8_2$, a silicon nitride layer $6_3$, a silicon oxide layer $8_3$, and a silicon nitride layer $6_4$ (wherein the subscript number designates a numerical order of the layer in the stack 10).

More generally, the stack comprises at least a layer $6_1$ of the first material, forming the lower layer of the stack, and a layer $8_1$ of the second material, formed on top of and in contact with layer $6_1$. Layer $8_1$ may then be covered with any number of alternated layers 6 and 8, where the upper layer of the stack may be a layer 6 of the first material or a layer 8 of the second material. Preferably, the stack comprises at least two layers $6_1$ and $6_2$ of the first material separated by layer $8_1$ of the second material. The total thickness of the stack is for example in the range from 1 to 20 µm.

Stack 10, for example, corresponds to a stack of interconnection layers comprising, in addition to insulating layers 6 and 8, interconnection metallizations (not shown in the drawing) enabling to connect chip components together and/or to terminals of connection of the chip to a device external to the chip. In this example, cavity 12 is formed in an area of stack 10 comprising no interconnection metallizations.

It is here desired to form in stack 10 a cavity 12 having relatively large horizontal dimensions, that is, dimensions in top view, for example, having all its horizontal dimensions greater than 100 µm, for example, greater than 500 µm, for example, greater than 1 mm. It is desired in this example for the bottom of cavity 12 to be as close as possible to layer 4 located under stack 10, without for all this etching, even partially, layer 4. In the case of a photonic chip, the aim being to be able to bring the end of the optical fiber as close as possible to layer 4 and to substrate 2, without however damaging them, to optimize the optical connection between the fiber and the chip components.

As an example, it is desired to form a cavity 12 having a depth in the range from 1 to 20 µm, for example, in the range from 5 to 20 µm.

In the example of FIG. 1, cavity 12 is formed by a step of non-selective etching of the insulating materials of layers 6 and 8 of stack 10, that is, a method etching substantially at the same speed the materials of layers 6 and 8. The etch time is determined to come as close as possible to layer 4, without etching it.

As shown in FIG. 1, a disadvantage of this method is that the etching of stack 10 is performed more rapidly in a peripheral region 14 of cavity 12 than in a central region 15 of the cavity. Thus, at the end of the etching, peripheral region 14 of the cavity is deeper than its central region 15. This is a phenomenon generally called "trenching". The bottom of the cavity is however substantially flat in central region 15 of the cavity. As an example, for a cavity having a central region 15 having a depth of approximately 8 µm, peripheral region 14 may have an additional depth of approximately 600 nm with respect to central region 15. The etching being interrupted before the cavity reaches layer 4 in its peripheral region 14, the bottom of the cavity is relatively distant from layer 4 in central region 15 of the cavity.

Another possibility would be to provide an etch method comprising successively etching layers 6 and 8 by selective etch methods, that is, capable of successively etching each layer 6 selectively over the material of the underlying layer 8, and each layer 8 selectively over the material of the underlying layer 6. Selective etching means an etch method capable of selectively etching a first material over a second material, that is, capable of etching the first material at least twice as fast as the second material, preferably at least three times as fast. Such a method has the advantage of decreasing the amplitude of the trenching phenomenon illustrated in FIG. 1, but has the disadvantage of being slow and expensive.

FIGS. 2A to 2E are cross-section views illustrating steps of a method of carrying out a method of forming a cavity 40 in a stack of layers coating the substrate of a chip. The structure of the chip considered in the example of FIGS. 2A to 2E is identical or similar to the structure of the chip described in relation with FIG. 1. Further, the cavity 40 which is desired to be formed in the example of FIGS. 2A to 2E has dimensions identical or similar to those of cavity 12 of FIG. 1.

Figure 2A:
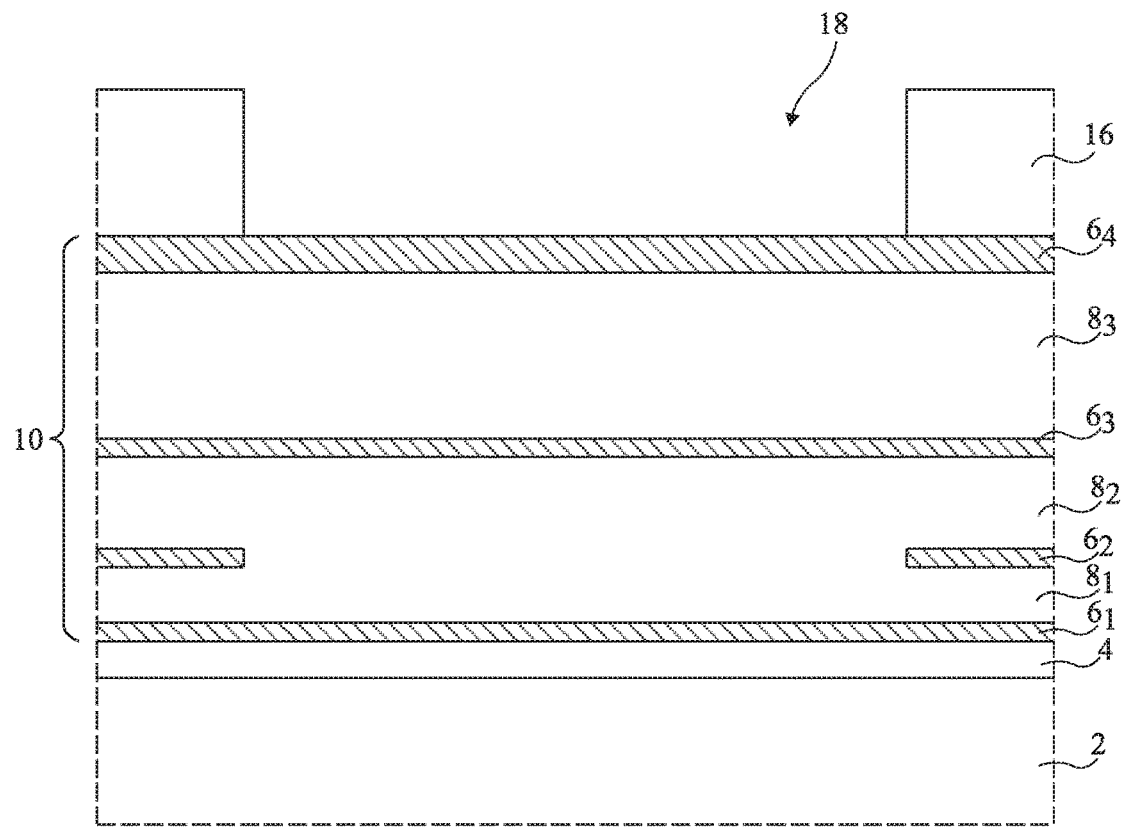
FIGS. 2A to 2E are cross-section views illustrating steps of an embodiment of a method of forming a cavity in a stack of layers coating the chip substrate.

FIG. 2A illustrates an initial manufacturing step. During this step, optical, electronic, and/or optoelectronic integrated circuit components (not shown) are formed inside and/or on top of substrate 2 of the chip. Insulating layer 4 is then deposited on substrate 2. The stack of layers 10 is then formed on layer 4.

It should be noted that in this example, layer $6_2$ has been formed in a manner (for example, by being etched all over the surface of the area where cavity 40 is desired to be formed) so that, in the area where cavity 40 is desired to be formed, the layer $6_2$ is not present and the lower surface of layer $8_2$ is directly in contact with the upper surface of layer $8_1$.

An etch mask 16, for example, made of resin, is then formed on the upper surface of stack 10. Mask 16 comprises an opening 18 opposite the location where cavity 40 is desired to be formed.

Figure 2B:
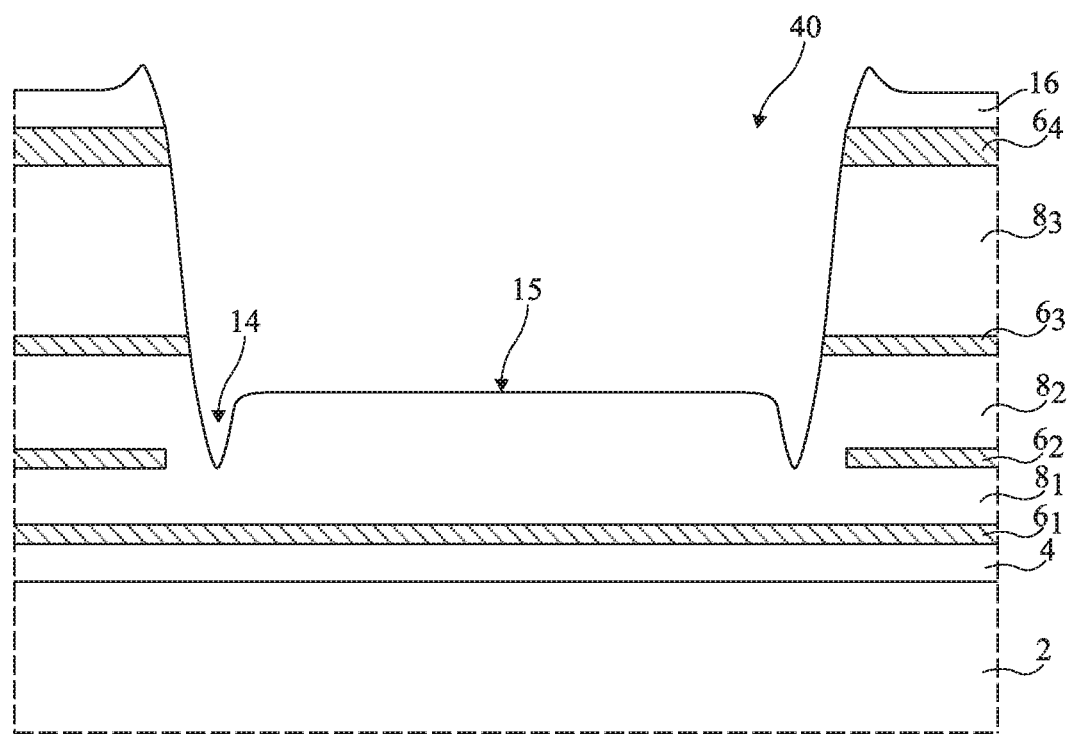

FIG. 2B illustrates a step of partial forming of cavity 40 through opening 18 by a first etch method.

The first etch method is a non-selective etch method similar to the method described in relation with FIG. 1, that is, capable of etching the materials of layers 6 and 8 approximately at the same speed.

The first etch method is, for example, a plasma etch method, for example, a reactive ion etching method. The plasma is, for example, a plasma made up of carbon tetrafluoride ($CF_4$) and of nitrogen, at high pressure, for example, under a pressure in the range from 80 to 200 mTorr. The etch plasma is, for example, generated at a power in the range from 1,000 to 1,800 W.

At the end of this step, cavity 40 comprises, as described in relation with FIG. 1, a central region 15 having a substantially flat bottom, and a peripheral region 14 deeper than central region 15.

During this step, the etch time is determined so that, at the end of the etching, the bottom of the cavity, in its peripheral region 14, is located above layer $6_1$, and that the bottom of the cavity, in its central region 15, is located in layer $8_1$ or in layer $8_2$. As an example, during this step, from 60 to 95% of the thickness of stack 10 is removed.

Figure 2C:
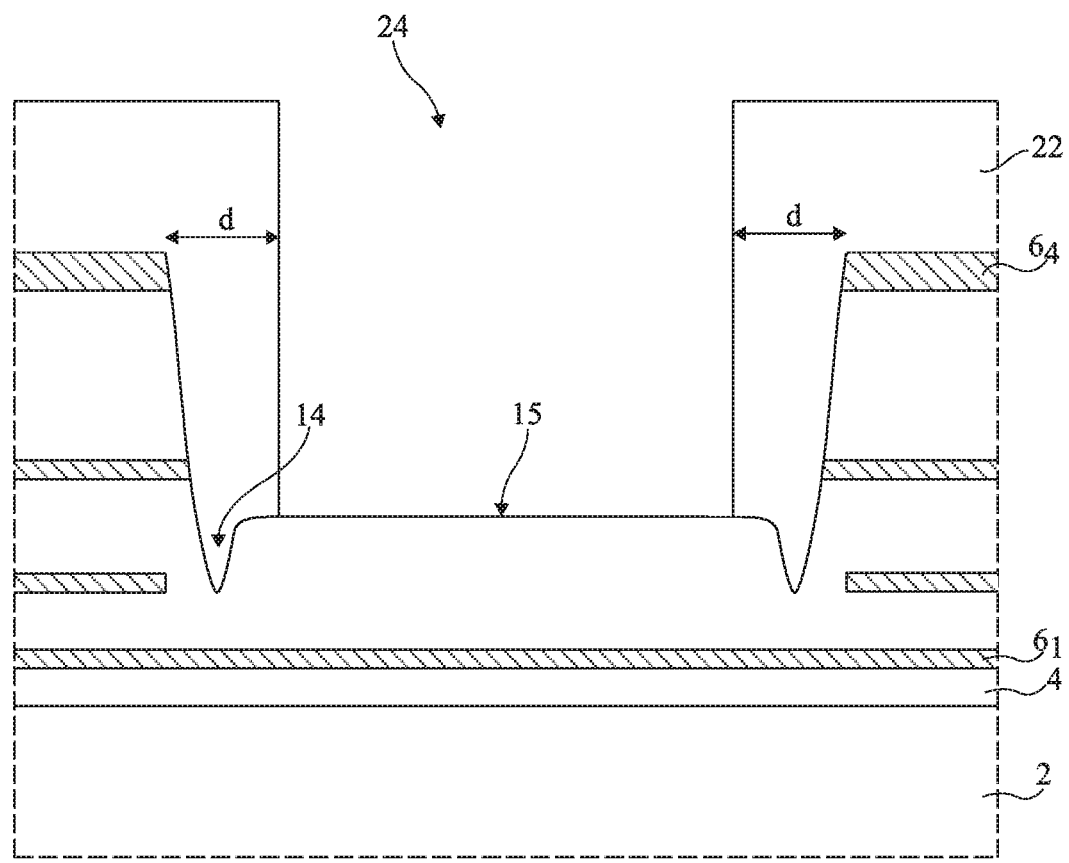

FIG. 2C illustrates the forming of an etch mask 22, for example, made of resin, on the upper surface of stack 10. Etch mask 16, used at the previous step, may be previously removed and replaced with mask 22, or be kept or covered by mask 22. Mask 22 comprises, opposite cavity 40, an opening 24 having horizontal dimensions smaller than the horizontal dimensions of opening 18 of mask 16. More particularly, the dimensions and the location of opening 24 are selected so that mask 22 entirely covers peripheral region 14 of cavity 40 and leaves central region 15 of cavity 40 exposed. As an example, mask 22 totally fills cavity 40 in its peripheral region 14.

In top view, width d of peripheral region 14 of cavity 40 is in the range from 10 to 100 µm, for example, in the order of 20 µm, and the horizontal dimensions of opening 24 of mask 22 are smaller by at least approximately twice width d than the horizontal dimensions of opening 18 of mask 16, so that, in top view, opening 24 of mask 22 only extends on substantially planar central region 15 of the cavity obtained at the end of the first etch step, as illustrated in FIG. 2B.

Figure 2D:
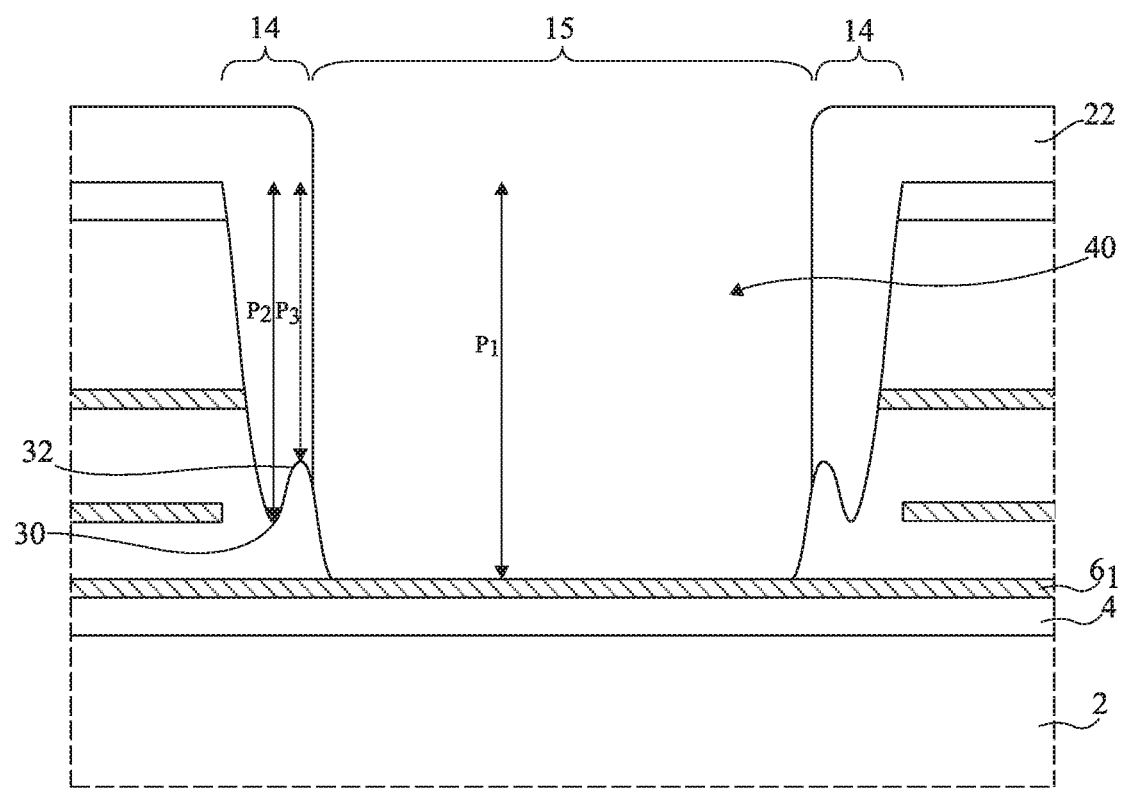

FIG. 2D illustrates a step of extension of cavity 40, through opening 24, by a second etch method. The second etch method is an etch method capable of etching the material of layers $8_1$ and $8_2$ selectively over the material of layer $6_1$.

During this step, the portions of layers $8_1$ and $8_2$ located opposite opening 24 are removed. The etching is interrupted when the bottom of cavity 40 reaches the upper surface of layer $6_1$.

The second etch method is, for example, a plasma etch method, for example, a reactive ionic etching method. The etch plasma is, for example, a plasma made up of octafluorocyclobutane ($C_4F_8$) and of dioxygen ($O_2$), at a pressure, for example, in the range from 60 to 120 mTorr. The etch plasma is, for example, generated at a power in the range from 2,500 to 3,000 W.

An advantage of providing, for the second etch step, a mask 22 having an opening 24 with dimensions smaller than the dimensions of opening 18 of mask 16 used for the first etch step and only leaving central region 15 of the cavity obtained at the end of the first etch step exposed, is that, at the beginning of the second etch step, the upper surface of the region to be etched is substantially planar. In other words, the region etched during the second etch step has a substantially uniform thickness. As a result, at the end of the second etch step, the upper surface of layer $6_1$ is exposed over substantially the entire surface area opposite opening 24 and that the bottom of the cavity remains substantially planar in portion 15 of the cavity.

After the steps of etching FIGS. 2C and 2D, central region 15 of the cavity has a depth P1, and peripheral region 14 of the cavity has a maximum depth P2, smaller than depth P1, reached in an area 30. Area 30 is separated from central region 15 of cavity 40 by a protrusion 32 of material of layers $8_1$ and $8_2$. Distance P3 between the top of the protrusion and the upper surface of stack 10 is smaller than depth P2.

Figure 2E:
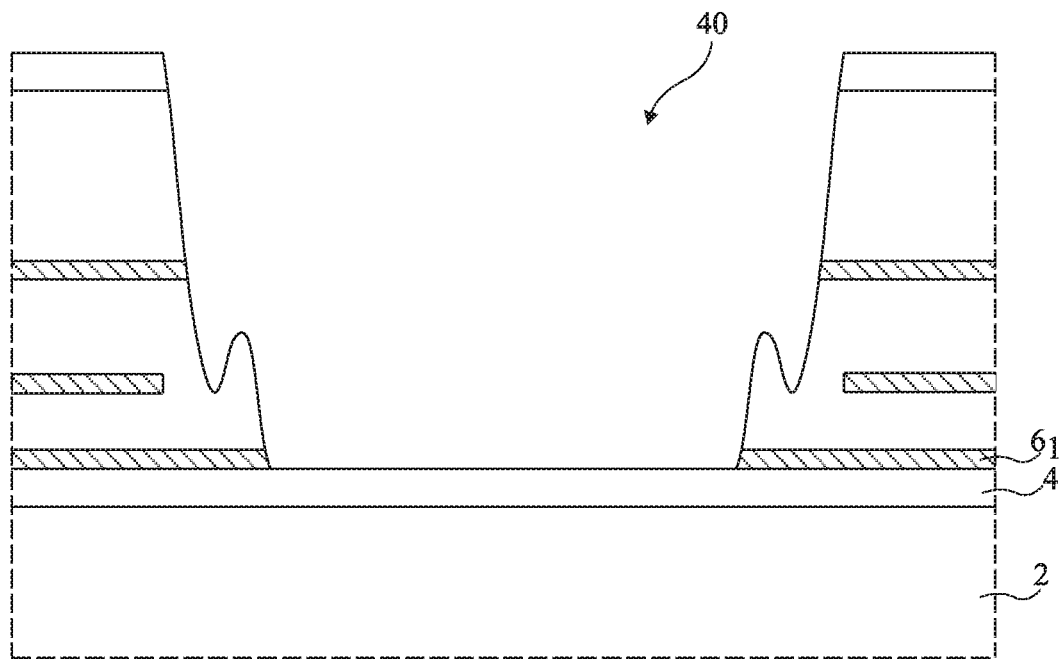

FIG. 2E illustrates a step of etching layer $6_1$ at the bottom of cavity 40 down to the upper surface of layer 4. For this etch step, mask 22 may be kept, and the etch method implemented at this step is capable of etching the material of layer $6_1$ selectively over the material of the layer having layer $6_1$ directly resting thereon (layer 4 in the present example). Layer $6_1$ may be a relatively thin layer, for example, with a thickness in the range from 30 nm to 100 nm. The etching of layer $6_1$ is then relatively fast and uniform. To improve the uniformity of this etching, the power and/or biasing of the plasma may be pulsed. At the end of this step, the bottom of central region 15 of cavity 40 is formed by the upper surface of layer 4.

As a variation, the step of etching layer $6_1$ may be omitted, the final cavity then being that shown in FIG. 2D.

Specific embodiments have been described. Various alterations, modifications, and improvements will occur to those skilled in the art. In particular, as a variation, layer 4 of the example of FIGS. 2A to 2E may be omitted, layer $6_1$ then directly resting on substrate 2.

Further, as a variation, on forming of stack 10, it is possible for layer $6_2$ not to be etched, as in the example described herein, in the region of forming cavity 40. This is for example true when this layer is desired to be used as an intermediate stop layer.

In the case where stack 10 comprises no layers made of the material of layer $6_1$ other than layer $6_1$, the first etch method may be any method capable of etching the layers located above layer $6_1$. It is then indifferent for the method to be selective or not over the material of layer $6_1$, since the etching is stopped before reaching layer $6_1$.

Further, the described embodiments are not limited to the examples of materials and of dimensions mentioned in the present disclosure. Furthermore, it will be apparent to those skilled in the art that the various features described in relation with the various embodiments could be combined, in alternative embodiments, in any combination.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method, comprising:
   depositing a first layer made of a first material;
   depositing a second layer made of a second material on top of an upper surface of the first layer;
   depositing a third layer made of the first material on top of an upper surface of the second layer;
   depositing a fourth layer made of the second material on top of an upper surface of the third layer;
   wherein the third layer includes a first opening and wherein material of the fourth layer is located within the first opening;
   forming a first etch mask over the fourth layer, the first etch mask having a second opening aligned with the first opening;
   etching the fourth layer through the first opening to form a first cavity having a depth which does not reach the second layer;
   forming a second etch mask over the fourth layer and within the first cavity, the second etch mask having a third opening which is aligned with the first cavity, wherein dimensions of the third opening are, in top view, smaller than dimensions of the first opening and second opening; and
   etching a remaining portion of the fourth layer and the second layer through the third opening to form a second cavity having a depth which reaches the upper surface of the first layer.

2. The method of claim 1, further comprising etching the first layer through the second cavity.

3. The method of claim 1, wherein the first and second materials are insulating materials.

4. The method of claim 1, wherein the first and second materials are, respectively, silicon nitride and silicon oxide.

5. The method of claim 1, wherein etching the fourth layer comprises performing a plasma etch by means of a plasma made up of $CF_4$ and of nitrogen.

6. The method of claim 1, wherein etching the remaining portion of the fourth layer and the second layer comprises performing plasma etch by means of a plasma made up of $C_4F_8$ and of dioxygen.

7. The method of claim 1, further comprising removing the first mask before forming the second mask.

8. A method, comprising:
   a) forming a stack of layers which includes a first layer made of a first material, a second layer made of a second material, the first layer forming a lower layer of the stack, and an upper surface of the first layer being in contact with a lower surface of the second layer, a third layer made of the first material above the second layer, and a fourth layer made of the second material above the third layer, wherein the third layer includes a layer opening such that a bottom of the fourth layer extends through the layer opening and is in contact with a top of the second layer;

b) forming, on an upper surface of the stack of layers, a first etch mask having a first opening;

c) etching the stack of layers opposite the first opening to a depth located at least at the second layer and passing through the layer opening;

d) forming, on the upper surface of the stack, a second mask having a second opening, wherein dimensions of the second opening are, in top view, smaller than dimensions of the first opening, the second opening being located, in top view, opposite an area etched at step c); and e) etching the second layer opposite the second opening by an etch method capable of etching the second material selectively over the first material, to reach the upper surface of the first layer.

9. The method of claim 8, wherein, in top view, all the dimensions of the first opening are greater than 100 μm.

10. The method of claim 8, wherein, in top view, all the dimensions of the second opening are smaller by from 20 to 100 μm than the dimensions of the first opening.

11. The method of claim 8, wherein the first and second materials are insulating materials.

12. The method of claim 8, wherein the first and second materials are, respectively, silicon nitride and silicon oxide.

13. The method of claim 8, wherein the etch method implemented at step c) is a method of plasma etching by means of a plasma made up of $CF_4$ and of nitrogen.

14. The method of claim 8, wherein the etch method implemented at step e) is a method of plasma etching by means of a plasma made up of $C_4F_8$ and of dioxygen.

15. The method of claim 8, comprising a step f), subsequent to step e), of etching completely through the first layer forming the lower layer of the stack to reach an insulating layer below the first layer.

16. The method of claim 8, further comprising removing the first mask before forming the second mask.

* * * * *